US008932798B2

(12) United States Patent
Kato

(10) Patent No.: US 8,932,798 B2
(45) Date of Patent: Jan. 13, 2015

(54) ALKALI-DEVELOPABLE PHOTOSENSITIVE RESIN COMPOSITION

(75) Inventor: Kenji Kato, Jiangsu (CN)

(73) Assignee: Taiyo Ink (Suzhou) Co., Ltd., Suzhou (CN)

( * ) Notice: Subject to any disclaimer, the term of this patent is extended or adjusted under 35 U.S.C. 154(b) by 0 days.

(21) Appl. No.: 13/809,745

(22) PCT Filed: Sep. 13, 2010

(86) PCT No.: PCT/JP2010/005576

§ 371 (c)(1),
(2), (4) Date: Jan. 11, 2013

(87) PCT Pub. No.: WO2012/023164

PCT Pub. Date: Feb. 23, 2012

(65) Prior Publication Data

US 2013/0122420 A1 May 16, 2013

(30) Foreign Application Priority Data

Aug. 20, 2010 (CN) .......................... 2010 1 0259634

(51) Int. Cl.

| | |
|---|---|
| ***G03C 1/00*** | (2006.01) |
| ***G03F 7/00*** | (2006.01) |
| ***G03F 7/004*** | (2006.01) |
| ***G03F 7/031*** | (2006.01) |
| ***G03F 7/09*** | (2006.01) |
| ***G03F 7/027*** | (2006.01) |
| ***C09D 133/14*** | (2006.01) |

(52) U.S. Cl.

CPC ................ *G03F 7/09* (2013.01); *G03F 7/0048* (2013.01); *G03F 7/031* (2013.01); *G03F 7/027* (2013.01); *C09D 133/14* (2013.01)

USPC ................... 430/270.1; 430/281.1; 430/287.1

(58) Field of Classification Search

CPC ...... C07C 1/00; C07C 201/00; C09D 133/14; G03F 1/00; G03F 2007/00; G03F 7/0004; G03F 7/031; G03F 7/09; C07B 31/00; C08F 2/50

USPC ............................................... 430/270.1, 306

See application file for complete search history.

(56) References Cited

U.S. PATENT DOCUMENTS

| | | | |
|---|---|---|---|
| 5,009,982 A * | 4/1991 | Kamayachi et al. | 430/280.1 |
| 2007/0185300 A1* | 8/2007 | Kojima et al. | 528/44 |
| 2009/0071697 A1* | 3/2009 | Ishikawa et al. | 174/254 |
| 2010/0104972 A1 | 4/2010 | Watanabe et al. | |

FOREIGN PATENT DOCUMENTS

| | | |
|---|---|---|
| CN | 101303528 | 11/2008 |
| JP | 61 243869 | 10/1986 |
| JP | 8-136712 | 5/1996 |
| JP | 2003 253212 | 9/2003 |
| JP | 2007 3789 | 1/2007 |
| JP | 2007003789 A * | 1/2007 |
| JP | 2007-316545 | 12/2007 |
| JP | 2008 70480 | 3/2008 |
| JP | 2009-237057 | 10/2009 |
| WO | 2007 015352 | 2/2007 |

OTHER PUBLICATIONS

International Preliminary Report on Patentability Issued Mar. 19, 2013 in PCT/JP10/005576 Filed Sep. 13, 2010.

International Search Report Issued Nov. 9, 2010 in PCT/JP10/005576 Filed Sep. 13, 2010.

Office Action issued Jun. 6, 2013 in Taiwanese Patent Application No. 10220737460 (with partial English translation).

Office Action issued Jul. 26, 2012 in Chinese Patent Application No. 201010259634.0 (with English translation).

Office Action issued Jul. 1, 2014 in Japanese Patent Application No. 2012-529418 (with partial English translation).

Solvesso 100 Fluid, Safety Data Sheet, Aug. 9, 2013.

Solvesso 150 Fluid, Safety Data Sheet, Aug. 9, 2013.

* cited by examiner

*Primary Examiner* — Chanceity Robinson

(74) *Attorney, Agent, or Firm* — Oblon, Spivak, McClelland, Maier & Neustadt, L.L.P.

(57) ABSTRACT

Provided is an alkali-developable photosensitive resin composition, the dry coating film of which has a favorable dryness to touch, excellent storage stability and few substances that are harmful to humans. The alkali-developable resin composition comprising (A) a carboxyl group-containing resin, (B) a photopolymerization initiator, (C) a compound with two or more ethylenic unsaturated groups in the molecule, (D) filler and (E) an aromatic petroleum solvent, is characterized in that the naphthalene content of said composition is 300 ppm or less.

4 Claims, No Drawings

ALKALI-DEVELOPABLE PHOTOSENSITIVE RESIN COMPOSITION

TECHNICAL FIELD

The present invention relates to an alkali-developable photosensitive resin composition suitable for the formation of a solder resist of a printed wiring board, or the like and to a cured product thereof, and particularly relates to an alkali-developable photosensitive resin composition that is superior in the dryability to finger touch of a dried coating and in storage stability and is capable of forming a pattern of a cured coating low in the content of a toxic substance that adversely affect a human body, and a cured product thereof and a printed wiring board obtained using the same.

BACKGROUND ART

Presently, as a solder resist for part of the household grade printed wiring boards and for virtually all the industrial grade printed wiring boards, a liquid developing type solder resist which is to be irradiated with ultraviolet light and then developed to form an image and thereafter finally cured (finish curing) by heating or exposure to light is adopted from the viewpoint of ensuring high accuracy and high density. Further, with consideration for environmental problem, liquid solder resists of the alkali developing type which implement development with a dilute aqueous alkali solution as a developer have come to play the leading role. As such alkali developing type solder resists using a dilute aqueous alkali solution, for example, liquid resist ink compositions including an active energy ray-curable resin produced by the addition of a polybasic acid anhydride to a reaction product of a novolak type epoxy compound with an unsaturated monocarboxylic acid, a photopolymerization initiator, an organic solvent, and an epoxy compound like those disclosed in Patent Literature 1 have been used widely.

From an alkali-developable resist ink composition of the above-described configuration, a cured coating superior in fastness of adhesion, hardness, heat resistance, resistance to electroless gold plating, and electrical insulation property can be obtained via an application step of applying the composition to a printed wiring substrate, a drying step of volatilizing the organic solvent in order to enable contact exposure, an exposure step of contact exposing the dried coating, a development step of removing unexposed parts of the coating exposed in a desired pattern, by alkali development, and a thermal cure step for obtaining sufficient coating characteristics. The steps each have a significant role, and if even one of the steps is out of the proper specification conditions of a solder resist, a resulting coating will fail to have sufficient characteristics. For example, generally during exposure to light, a tool, called photomask, which is a polyethylene terephthalate (PET) film or glass having a desired pattern drawn thereon is placed on a dried coating, the pressure of an exposure environment is reduced for preventing the photomask from shifting in position during the exposure or oxygen inhibition during photoreaction, and the exposure is performed with the dried coating being in contact with the photomask under pressure. One probable problem with the exposure is the sticking of the photomask to the dried coating which will occur at the time of peeling the photomask after the completion of the exposure. One conceivable cause for the sticking is poor dryability to finger touch (the degree of tackiness) of the dried coating.

CITATION LIST

Patent Literature

PLT 1: Japanese Patent Application Laid-Open No. 61-243869

SUMMARY OF THE INVENTION

Technical Problem

In view of the above-mentioned problems, it is an object of the present invention to provide an alkali-developable photosensitive resin composition that is superior in the dryability to finger touch of a dried coating and in storage stability and is capable of forming a pattern of a cured coating low in the content of a toxic substance that adversely affect a human body, and a cured product thereof.

Solution to Problem

As a result of intense research in order to solve the above-described problem, the inventor has found that the problem can be solved by using a petroleum aromatic solvent with a naphthalene content reduced to a certain value or less as an organic solvent for dissolving and diluting synthetic resin in an alkali-developable photosensitive resin composition. Thus, the present invention has been accomplished.

Namely, the present invention provides an alkali-developable photosensitive resin composition including: (A) a carboxyl group-containing resin; (B) a photopolymerization initiator; (C) a compound having two or more ethylenically unsaturated groups in the molecule thereof; (D) a filler; and (E) a petroleum aromatic solvent, wherein the naphthalene content of the composition is 300 ppm or less.

Further, the present invention provides the alkali-developable photosensitive resin composition wherein the naphthalene content of the petroleum aromatic solvent (E) is 500 ppm or less.

Further, the present invention provides the alkali-developable photosensitive resin composition wherein the petroleum aromatic solvent (E) contains 1,2,4-trimethylbenzene, 1,2,3-trimethylbenzene, an aromatic component having 10 carbon atoms, 1,3,5-trimethylbenzene, benzene, toluene, and xylene.

Further, the present invention provides the alkali-developable photosensitive resin composition wherein the petroleum aromatic solvent (E) is characterized in that the content of 1,2,4-trimethylbenzene and 1,2,3-trimethylbenzene is 10 to 30% by volume, the content of the aromatic component having 10 carbon atoms is 60% by volume or more, the content of 1,3,5-trimethylbenzene is less than 1% by volume, and the content of benzene, toluene, and xylene is less than 0.01% by volume.

Further, the present invention provides the alkali-developable photosensitive resin composition further including (F) a thermosetting component.

Further, the present invention provides a photocurable dry film obtained by applying the alkali-developable photosensitive resin composition to a carrier film and then drying the composition.

Further, the present invention provides a cured product obtained by photocuring the alkali-developable photosensitive resin composition or the dry film on copper.

Further, the present invention provides a printed wiring board obtained by photocuring and then thermally curing the dry film.

Advantageous Effects of Invention

With the alkali-developable photosensitive resin composition of the present invention, the use of a petroleum aromatic solvent low in naphthalene content as an organic solvent improves the volatility of a solvent during a drying step before exposure to light, improves the dryability to finger touch of a dry coating, and improves the workability during the production of a printed wiring board.

Since the petroleum hydrocarbon solvent of the present invention is high in solvency for the ingredients contained in the alkali-developable photosensitive resin composition, the solvent can prevent the generation of so-called reagglomeration, which is a phenomenon that a crystalline foreign matter precipitates in the composition during its preservation at low temperature (5° C. or lower), so that it improves the storage stability of the photosensitive resin composition.

Moreover, by the reduction of the naphthalene content of a petroleum aromatic solvent to a certain value or less, there can be provided a photosensitive resin composition and a cured product thereof which are low in the content of a toxic substance that adversely affect a human body.

DESCRIPTION OF EMBODIMENTS

As a result of intense research for attaining the above-described object, the present inventor has accomplished the present invention by finding that in an alkali-developable photosensitive resin composition including (A) a carboxyl group-containing resin, (B) a photopolymerization initiator, (C) a compound having two or more ethylenically unsaturated groups in the molecule thereof, and (D) a filler, the use of (E) a petroleum aromatic solvent low in naphthalene content as an organic solvent and the adjustment of the naphthalene content of the photosensitive resin composition to 300 ppm or less can attain excellent dryability to finger touch of a dry coating, can achieve good storage stability, and can afford a composition reduced in the content of a toxic substance that adversely affects a human body.

The respective constituents of the alkali-developable photosensitive resin composition of the present invention are explained in detail below.

(A) Carboxyl Group-Containing Resin

Conventionally used resin compounds each having a carboxyl group in the molecule thereof can be used as the carboxyl group-containing resin (A) contained in the alkali-developable photosensitive resin composition of the present invention. A carboxyl group-containing photosensitive resin further having an ethylenically unsaturated double bond in the molecule thereof (A') is more preferred in photocurability or development resistance.

Specific examples of the carboxyl group-containing resin (A) are preferably such compounds as listed below, which may be either oligomers or polymers. The examples include, but are not limited to, (1) carboxyl group-containing copolymerizable resin obtained by copolymerizing an unsaturated carboxylic acid such as (meth)acrylic acid with other one or more compounds having an unsaturated double bond, (2) photosensitive carboxyl group-containing copolymerized resin obtained by adding an ethylenically unsaturated group as a pendant to a copolymer of an unsaturated carboxylic acid such as (meth)acrylic acid with other one or more compounds having an unsaturated double bond by using a compound having an epoxy group and an unsaturated double bond, such as glycidyl(meth)acrylate and 3,4-epoxycyclohexylmethyl (meth)acrylate, (meth)acryloyl chloride, or the like, (3) photosensitive carboxyl group-containing copolymerized resin obtained by reacting an unsaturated carboxylic acid such as (meth)acrylic acid to a copolymer of a compound having an epoxy group and an unsaturated double bond, such as glycidyl(meth)acrylate and 3,4-epoxycyclohexylmethyl (meth)acrylate, and other one or more compounds having an unsaturated double bond, and then reacting a polybasic acid anhydride to a secondary hydroxyl group that has been formed, (4) photosensitive carboxyl group-containing copolymerized resin obtained by reacting a compound having a hydroxyl group and an unsaturated double bond such as 2-hydroxylethyl(meth)acrylate to a copolymer of an acid anhydride having an unsaturated double bond such as maleic anhydride and another compound having an unsaturated double bond, (5) carboxyl group-containing photosensitive resin obtained by reacting a polyfunctional epoxy compound and an unsaturated monocarboxylic acid together and then reacting a saturated or unsaturated polybasic acid anhydride to a hydroxyl group that has been formed, (6) photosensitive resin containing a hydroxy group and a carboxyl group obtained by reacting a saturated or unsaturated polybasic acid anhydride to a hydroxy group-containing polymer such as polyvinyl alcohol derivatives and then reacting a compound having an epoxy group and an unsaturated double bond to the generated carboxylic acid, (7) carboxyl group-containing photosensitive resin obtained by reacting a saturated or unsaturated polybasic acid anhydride to a reaction product of a polyfunctional epoxy compound, an unsaturated monocarboxylic acid, at least one alcoholic hydroxy group in one molecule, and a compound having a reactive group other than an alcoholic hydroxy group reactive with an epoxy group, (8) carboxyl group-containing photosensitive resin obtained by reacting an unsaturated monocarboxylic acid to a polyfunctional oxetane compound having at least two oxetane rings in one molecule, and then reacting a saturated or unsaturated polybasic acid anhydride to a primary hydroxy group in the resulting modified oxetane resin, and (9) carboxyl group-containing photosensitive resin obtained by reacting an unsaturated monocarboxylic acid to a polyfunctional epoxy resin, then reacting a polybasic acid anhydride, and further reacting a compound having one oxirane ring and one or more ethylenically unsaturated group in the molecule thereof to the resulting carboxyl group-containing resin.

Preferred among these examples are the carboxyl group-containing resins (2), (5), (7), and (9).

In the present description, (meth)acrylate is a term that collectively encompasses acrylate, methacrylate, and their mixture, and this is also applied to other similar expressions used hereinafter.

The above-described carboxyl group-containing resin (A) makes it possible to perform development by using a dilute aqueous alkali solution because it has many free carboxyl groups on the side chains of its backbone polymer.

The acid value of the carboxyl group-containing resin (A) is preferably within the range of 40 to 200 mgKOH/g, more preferably within the range of 45 to 120 mgKOH/g. The case where the acid value of the carboxyl group-containing resin is less than 40 mgKOH/g is undesirable because it will become difficult to perform alkali development. On the other hand, the case where the acid value exceeds 200 mgKOH/g is also undesirable because lines will become thinner than required due to excessive progress of dissolution of exposed parts by a developer and, in some occasions, dissolution and exfoliation by a developer will occur without making a distinction between exposed parts and unexposed parts, so that it will become difficult to draw a normal resist pattern.

The weight average molecular weight of the carboxyl group-containing resin (A), which varies depending upon the skeleton of the resin, is generally within the range of 2,000 to 150,000, preferably 5,000 to 100,000. If the weight average molecular weight is less than 2,000, tack-free performance after application to a substrate and drying may be inferior and the moisture resistance of a coating after exposure to light may be poor, so that film loss may occur during development and resolution may be greatly inferior. Conversely, if the weight average molecular weight exceeds 150,000, developability may become remarkably bad and storage stability may be inferior.

The loading of such a carboxyl group-containing resin (A) is preferably within the range of 20 to 60% by mass of the whole composition, more preferably within the range of 30 to 50% by mass. The case that the loading of the carboxyl group-containing resin (A) is less than the above range is undesirable because coating strength may lower. On the other hand, the case that it is more than the above range is undesirable because the viscosity of a composition may become high or the spreadability or the like may deteriorate.

(B) Photopolymerization Initiator

Examples of the photopolymerization initiator (B) that can be used suitably for the alkali-developable photosensitive resin composition of the present invention include benzoin and benzoin alkyl ether, such as benzoin, benzoin methyl ether, benzoin ethyl ether, and benzoin isopropyl ether;

acetophenones, such as acetophenone, 2,2-dimethoxy-2-phenylacetophenone, 2,2-diethoxy-2-phenylacetophenone, 1,1-dichloroacetophenone, and 1-[4-(4-benzoylphenylsulfanyl)-2-methyl-2-(4-meth ylphenylsulfanyl)propan-1-one;

aminoacetophenones, such as 2-methyl-1-[4-(methylthio) phenyl]-2-morpholinopropanone-1 and 2-benzyl-2-dimethylamino-1-(4-morpholinophenyl)-butanone-1;

anthraquinones, such as 2-methylanthraquinone, 2-ethylanthraquinone, 2-tertiary-butylanthraquinone, and 1-chloroanthraquinone;

thioxanthones, such as 2,4-dimethylthioxanthone, 2,4-diethylthioxanthone, 2-chlorothioxanthone, and 2,4-diisopropylthioxanthone;

ketals, such as acetophenone dimethyl ketal and benzyl dimethyl ketal;

benzophenones or xanthones, such as benzophenone;

acylphosphine oxides, such as bis(2,6-dimethoxybenzoyl)(2,4,4-trimethylpentyl) phosphine oxide, bis(2,4,6-trimethylbenzoyl)-phenylphosphine oxide, 2,4,6-trimethylbenzoyldiphenylphosphine oxide, and ethyl-2,4,6-trimethylbenzoylphenyl phosphinate;

and various peroxides. These conventionally known photopolymerization initiators may be used singly or two or more of them may be used in combination.

As a preferred form of the photopolymerization initiator (B), there is used 2-benzyl-2-dimethylamino-1-(4-morpholinophenyl)-butanone-1, and examples of commercially available products thereof include Irgacure 369 produced by Ciba Specialty Chemicals. Such photopolymerization initiators are poor in solubility, and therefore if they are dissolved using other organic solvents, such ascarbitol acetate and dipropylene glycol monomethyl ether, and then preserved at low temperature (5° C. or lower), there will occur so-called reagglomeration, which is a phenomenon that a white crystalline foreign matter precipitates in the composition. In the present invention, by combining a petroleum aromatic solvent (E) low in naphthalene content with such a photopolymerization initiator, an effect of the present invention that reagglomeration of poorly soluble substances is prevented and excellent storage stability is attained can be developed remarkably.

The loading proportion of such a photopolymerization initiator (B) is suitably 0.01 to 30 parts by mass, preferably 5 to 25 parts by mass relative to 100 parts by mass of the carboxyl group-containing resin (A). The case where the amount of the photopolymerization initiator to be used is less than the above ranges is undesirable because the photocurability of the composition will become poor and the case where the amount of the photopolymerization initiator is excessively large is undesirable because properties as a solder resist will deteriorate.

(C) Compound Having Two or More Ethylenically Unsaturated Groups in the Molecule Thereof The compound having two or more ethylenically unsaturated groups in the molecule thereof (C) to be used for the alkali-developable photosensitive resin composition of the present invention is an agent capable of being cured by irradiation with an active energy ray to insolubilize the above-mentioned carboxyl group-containing resin (A) in an aqueous alkali solution or assist the insolubilization. Specific examples of such a compound include hydroxyalkyl acrylates, such as 2-hydroxyethyl acrylate and 2-hydroxypropyl acrylate;

mono or diacrylates of glycol, such as ethylene glycol, methoxytetraethylene glycol, polyethylene glycol, and propylene glycol;

acrylamides, such as N,N-dimethylacrylamide, N-methylolacrylamide, and N,N-dimethylaminopropylacrylamide;

aminoalkyl acrylates, such as N,N-dimethylaminoethyl acrylate and N,N-dimethylaminopropyl acrylate;

polyfunctional acrylates of polyhydric alcohols such as hexanediol, trimethylolpropane, pentaerythritol, dipentaerythritol, and tris-hydroxyethyl isocyanurate or ethylene oxide adducts or propylene oxide adducts thereof;

acrylates such as phenoxy acrylate, bisphenol A diacrylate, and ethylene oxide adducts or propylene oxide adducts of these phenols;

acrylates of glycidyl ethers such as glycerol diglycidyl ether, glycerol triglycidyl ether, trimethylolpropane triglycidyl ether, and triglycidyl isocyanurate; and melamine acrylate, and/or methacrylates corresponding to the acrylates enumerated above.

Further examples include epoxy acrylate resins prepared by reacting acrylic acid to polyfunctional epoxy resins such as cresol novolak type epoxy resin, and epoxyurethane acrylate compounds prepared by reacting a half urethane compound of a hydroxy acrylate such as pentaerythritol triacrylate and a diisocyanate such as isophorone diisocyanate to hydroxy groups of the epoxy acrylate resins.

The loading of the compound having two or more ethylenically unsaturated groups in the molecule thereof (C) is preferably a proportion of 5 to 100 parts by mass, more preferably a proportion of 1 to 70 parts by mass relative to 100 parts by mass of the carboxyl group-containing resin (A). The case where the loading is less than 5 parts by mass relative to 100 parts by mass of the carboxyl group-containing resin (A) is undesirable because the photocurability of the resulting alkali-developable photosensitive resin composition will deteriorate, so that it will become difficult to perform pattern formation by alkali development after the application of active energy rays. On the other hand, the case where it exceeds 100 parts by mass is undesirable because solubility in aqueous alkali solutions deteriorates and coatings will become brittle.

(D) Filler

Conventional inorganic or organic fillers can be used as the filler (D) to be used for the present invention. Examples thereof include barium sulfate, barium titanate, silicon oxide powder, spherical silica, talc, clay, magnesium carbonate, calcium carbonate, aluminum oxide, aluminum hydroxide, glass fiber, carbon fiber, and mica powder; especially, barium sulfate and spherical silica are used preferably.

Such filler (D) may be incorporated singly or two or more species thereof may be incorporated together. It can suppress the shrinkage of a coating when it is cured and can improve basic characteristics such as adhesion property and hardness. The loading of such filler (D) is a proportion of 0.1 to 200 parts by mass, preferably 1 to 100 parts by mass relative to 100 parts by mass of the carboxyl group-containing resin (A). The case where the loading of the filler (D) is less than 0.1 parts by mass relative to 100 parts by mass of the carboxyl group-containing resin (A) is undesirable because this will lower cured coating characteristics of the resulting alkali-developable photosensitive resin composition, such as solder heat resistance and gold plating resistance. On the other hand, the case where the loading exceeds 200 parts by mass is undesirable because the composition will become higher in viscosity and be deteriorated in printability and a cured product will become brittle.

(E) Petroleum Aromatic Solvent Low in Naphthalene Content

The present inventor found that the shortage of dryability to finger touch that will cause defective exfoliation of the above-described photomask is caused by the insufficient volatility of an organic solvent in a resin composition. As a result of intense research for attaining the above-described object on the basis of this finding, the present inventor found that a petroleum aromatic solvent reduced in naphthalene content to a certain value or less is unexpectedly excellent in volatility during drying while having excellent solvency as a solvent and therefore can form a dry coating good in dryability to finger touch, and can attain an effect to prevent the occurrence of sticking of a photomask at the time of peeling the photomask from the dry coating.

That is, the petroleum aromatic solvent with low naphthalene content to be used in the present invention has high solvency for other ingredients in the resin composition and the resulting photosensitive resin composition is good in storage stability. Moreover, workability can be improved through the improvement in the dryability to finger touch of a dried coating to be obtained.

While the petroleum aromatic solvent (E) low in naphthalene content of the present invention is just required to have a naphthalene content such that the naphthalene content of an alkali-developable photosensitive resin composition to be obtained is adjusted to 300 ppm or less, the naphthalene content of (E) is preferably up to 500 ppm relative to the petroleum aromatic solvent.

According to The International Agency for Research on Cancer (IARC), naphthalene, which is usually contained in petroleum solvents, has been reported as possibly having carcinogenicity of category 2B in the carcinogenicity rank, and according to a bill of ZLS (Germany's Central Authority of the Federal States for Safety), various legal limits has been reinforced, for example, a legal limit of the content of PAHs (polycyclic aromatic hydrocarbons) including naphthalene has been set as one requirement for gaining GS accreditation. According to the present invention, there can be provided a photosensitive resin composition that can cope with such restrictions and is low in the content of naphthalene that will adversely affect a human body, a cured product thereof, and a printed wiring board obtained using the same.

In preferred embodiments, the petroleum aromatic solvent (E) low in naphthalene content of the present invention contains 1,2,4-trimethylbenzene and 1,2,3-trimethylbenzene in 10 to 30% by volume, more preferably 20 to 26% by volume, in total based on the total volume of the petroleum aromatic solvent (E), contains aromatic components having 10 carbon atoms in 60% by volume or more, more preferably 65 to 75% by volume, contains 1,3,5-trimethylbenzene in less than 1% by volume, and contains benzene, toluene, and xylene in less than 0.01% by volume.

Benzene, xylene, naphthalene, etc. contained in a petroleum solvent may deteriorate working environment due to their odor and may adversely affect a human body. Since aromatics such as benzene, toluene, xylene, and naphthalene are greatly feared to have influence on a human body, use is limited and indication of the presence of compounds is obligated for materials containing more than 1% by volume of benzene by Ordinance on Prevention of Hazards due to Specified Chemical Substances of the Ministry of Labor and for materials containing more than 5% by weight of toluene and xylene in total by the Provisions of the Ordinance on the Prevention of Organic Solvent Poisoning of the Ministry of Labor. According to a preferred embodiment of the present invention, there can be provided a photosensitive resin composition that can cope with such restrictions and suppress the deterioration of working environment and is low in the content of toxic substances that will adversely affect a human body, a cured product thereof, and a printed wiring board obtained using the same.

The petroleum aromatic solvent (E) low in naphthalene content of the present invention can be produced by conventional methods such as selectively separating specific hydrocarbon components from refined petroleum or synthesizing.

For example, the above-mentioned 1,2,4-trimethylbenzene and 1,2,3-trimethylbenzene can be obtained by rectification of heavy ends of tar light oil or methylation or disproportionation of benzene and xylenes.

The above-mentioned aromatic components having 10 carbon atoms can be obtained by taking fractions having boiling points of 180 to 200° C. by precise distillation from reformed fractions obtained by a catalytic reforming reaction of naphtha. Examples of the aromatic components having 10 carbon atoms include aromatic hydrocarbons having 10 carbon atoms such as diethylbenzene, methylpropylbenzene, methylisopropylbenzene, tetramethylbenzene, butylbenzene, and methylindan.

As other components, there may be contained aromatics having 9 carbon atoms other than 1,2,4-trimethylbenzene and 1,2,3-trimethylbenzene and aromatics having 11 or more carbon atoms. Examples of the other aromatics having 9 carbon atoms mentioned above include o-ethylmethylbenzene, m-ethylmethylbenzene, p-ethylmethylbenzene, n-propylbenzene, isopropylbenzene, and indan. Examples of aromatics of having 11 carbon atoms include amylbenzene, butylmethylbenzene, ethylpropylbenzene, diethylmethylbenzene, dimethylindan, ethylindan, and methylnaphthalene. Examples of aromatics of having 12 carbon atoms include dipropylbenzene, triethylbenzene, and dimethylnaphtalene. The aromatics having 11 or more carbon atoms are contained in 10% by volume or less, preferably 5% by volume in view of volatility.

The petroleum aromatic solvent (E) low in naphthalene content of the present invention is preferably one having a boiling point of 160 to 200° C., more preferably 175 to 195° C. On the other hand, one having a flash point higher than 60.5° C. is preferred. The case where the flash point is 60.5° C. or lower is undesirable because a large amount of inflammable vapor can be generated to increase ignition danger when heating during the preparation of a resist ink. Since one having a flash point of 60.5° C. or lower correspond to the inflammable liquid of the "Recommendations on the Transport of Dangerous Goods, Model Regulations" of the United Nations and ones having a flash point of 61° C. or lower correspond to the inflammable liquid substances of "Regulations for the Carriage and Storage of Dangerous Goods by Ships", it is preferable that the flash point exceeds 61° C. The mixed aniline point is 16° C. or lower. It is undesirable that the mixed aniline point exceeds 16° C., because if so, the solubility of resin will deteriorate.

As such a petroleum aromatic solvent (E) low in naphthalene content, there can be used commercially available products, examples of which include Cactus Fine SF-01 produced by Japan Energy Corporation and Solvesso 150ND produced by Exxon Mobil Chemical Company.

Unless the effect of the present invention is impaired, the photosensitive resin composition of the present invention may contain an organic solvent (E') other than the petroleum aromatic solvent (E) low in naphthalene content.

Examples of such an organic solvent (E') include ketones, glycol ethers, glycol ether acetates, esters, alcohols, aliphatic hydrocarbons, and petroleum solvents other than petroleum aromatic solvent (E) low in naphthalene content of the present invention. More specific examples include ketones such as methyl ethyl ketone and cyclohexanone; glycol ethers such as cellosolve, methylcellosolve, butylcellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, dipropylene glycol methyl ether acetate, propylene glycol methyl ether acetate, propylene glycol ethyl ether acetate, and propylene glycol butyl ether acetate; alcohols such as ethanol, propanol, ethylene glycol, and propylene glycol; aliphatic hydrocarbons such as octane and decane; and petroleum solvents other than the petroleum aromatic solvent (E) of the present invention such as petroleum ether, petroleum naphtha, hydrogenated petroleum naphtha, and solvent naphtha. Such organic solvents may be used singly or as a mixture of two or more of them.

While the amounts of the petroleum aromatic solvent (E) low in naphthalene content and the organic solvent (E') to be used are not particularly limited, they are suitably within the range of about 30 to about 300 parts by weight in total based on 100 parts by weight of the carboxyl group-containing resins (A) and can be set appropriately according to the application method to choose.

(F) Thermosetting Component

Preferably, the alkali-developable photosensitive resin composition to be used for the present invention further contains (F) a thermosetting component in order to impart heat resistance to a cured coating. The thermosetting component (F) to be used for the present invention is not limited to specific one and examples thereof include various conventional thermosetting resins such as epoxy resin, guanamine resin, benzoguanamine resin, silicone resin, diallyl phthalate resin, phenol resin, melamine resin, urea resin, unsaturated polyester resin, urethane resin, and polyimide resin. In view of thermosetting characteristics and characteristics of cured film, epoxy compounds having two or more epoxy groups in one molecule are used particularly preferably.

Examples of such epoxy compounds include epoxy resins poorly soluble in organic solvent including bisphenol S type epoxy resins such as EBPS-200 produced by Nippon Kayaku Co., Ltd., EPX-30 produced by Asahi Denka Kogyo K.K., and EPICLON EXA-1514 produced by Dainippon Ink & Chemicals, Inc.; diglycidyl phthalate resins such as BLEMMER DGT produced by NOF Corporation; heterocyclic epoxy resins such as TEPIC Series produced by Nissan Chemical Industries, Ltd. and Araldite PT810 produced by Ciba Specialty Chemicals; bixylenol type epoxy resins such as YX-4000 produced by Yuka Shell Epoxy K.K.; biphenol type epoxy resins such as YL-6056 produced by Yuka Shell Epoxy K.K.; tetraglycidyl xylenoyl ethane resins such as ZX-1063 produced by Tohto Kasei Co., Ltd.; and epoxy resins soluble in organic solvent, including bisphenol A type epoxy resins such as EPICOAT 1009, 1031 produced by Yuka Shell Epoxy K.K., EPICLON N-3050, N-7050, N-9050 produced by Dainippon Ink & Chemicals, Inc., AER-664, AER-667, AER-669 produced by Asahi Chemical Industry Co., Ltd., YD-012, YD-014, YD-017, YD-020, YD-002 produced by Tohto Kasei Co., Ltd., XAC-5005, GT-7004, 6484T, 6099 produced by Ciba Specialty Chemicals, DER-642U, DER-673MF produced by Dow Chemical Co., EP-5400, EP-5900 produced by Asahi Denka Kogyo K.K.; hydrogenated bisphenol A type epoxy resins such as ST-2004, ST-2007 produced by Tohto Kasei Co., Ltd.; Bisphenol F type epoxy resins such as YDF-2004, YDF-2007 produced by Tohto Kasei Co., Ltd.; brominated bisphenol A type epoxy resins such as SR-BBS, SR-TBA-400 produced by Sakamoto Yakuhin Kogyo Co., Ltd., EP-62, EP-66 produced by Asahi Denka Kogyo K.K., AER-755, AER-765 produced by Asahi Chemical Industry Co., Ltd., YDB-600, YDB-715 produced by Tohto Kasei Co., Ltd.; novolac type epoxy resins such as EPPN-201, EOCN-103, EOCN-1020, EOCN-1025 produced by Nippon Kayaku Co., Ltd., ECN-278, ECN-292, ECN-299 produced by Asahi Chemical Industry Co., Ltd., ECN-1273, ECN-1299 produced by Ciba Specialty Chemicals, YDCN-220L, YDCN-220HH, YDCN-702, YDCN-704, YDPN-601, YDPN-602 produced by Tohto Kasei Co., Ltd., and EPICLON N-673, N-680, N-695, N-770, N-775 produced by Dainippon Ink & Chemicals, Inc.; novolac type epoxy resins of bisphenol A such as EPX-8001, EPX-8002, EPPX-8060, EPPX-8061 produced by Asahi Denka Kogyo K.K. and EPICLON N-880 produced by Dainippon Ink & Chemicals, Inc.; chelate type epoxy resins such as EPX-49-60, EPX-49-30 produced by Asahi Denka Kogyo K.K.; glyoxal type epoxy resins such as YDG-414 produced by Tohto Kasei Co., Ltd.; amino group-containing epoxy resins such as YH-1402, ST-110 produced by Tohto Kasei Co., Ltd. and YL-931, YL-933 produced by Yuka Shell Epoxy K.K.; rubber-modified epoxy resins such as EPICLON TSR-601 produced by Dainippon Ink & Chemicals, Inc., and EPX-84-2, EPX-4061 produced by Asahi Denka Kogyo K.K.: dicyclopentadiene phenolic type epoxy resins such as DCE-400 produced by Sanyo-Kokusaku Pulp Co., Ltd.; silicone-modified epoxy resins such as X-1359 produced by Asahi Denka Kogyo K.K.; epsilon-caprolactone-modified epoxy resins such as PLACCEL G-402, G-710 produced by Daicel Chemical Industries, Ltd.

Such epoxy resins may be used singly or two or more of them may be used in combination. The loading of the epoxy compound (F) as the thermosetting component is preferably a proportion of 5 to 100 parts by weight, more preferably 15 to 60 parts by weight relative to 100 parts by weight of the carboxyl group-containing resin (A).

In the composition of the present invention, an epoxy accelerator or a catalyst can be used together with the above-described epoxy resin. Examples of the epoxy accelerator or the catalyst include imidazole and imidazole derivatives, such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds, such as dicyandiamide, benzyldimethylamine, 4-(dimethylamino group)-N,N-dimethylbenzylamine, 4-methoxy-N,N-dimethylbenzylamine, and 4-methyl-N,N-dimethylbenzylamine; hydrazine compounds, such as adipic acid hydrazide and sebacic acid dihydrazide; and phosphorus compounds, such as triphenylphosphine; and examples of their commercial products include 2MZ-A, 2MZ-OK, 2PHZ, 2P4BHZ, and 2P4 MHZ (all are commercial names of imidazole-based compounds) produced by Shikoku Chemicals Corporation, U-CAT 3503× and U-CAT3502X (both are commercial names of dimethylamine block isocyanate compounds) produced by San-Apro Ltd., and DBU, DBN, U-CATSA102, and U-CAT5002 (all are dicyclic amidine compounds and salts thereof). The catalyst is not limited to these and a curing catalyst for epoxy resins or a substance which accelerates the reaction between an epoxy group and a carboxyl group can be used; such catalysts may be used singly or two or more of them may be used in combination. It is also permitted to use guanamine, acetoguanamine, benzoguanamine, melamine, S-triazine derivatives, such as 2,4-diamino group-6-methacryloiloxy-ethyl-S-triazine, 2-vinyl-2,4-diamino group-S-triazine, 2-vinyl-4,6-diamino group-S-triazine isocyanuric acid adducts, and 2,4-diamino group-6-methacryloiloxyethyl-S-triazine isocyanuric acid adducts, which can serve also as an adhesion promoter. Preferably, such a compound that can serve also as an adhesion promoter is used together with the curing catalyst. As to the loading of the curing catalyst, an ordinary quantitative proportion is much enough and, for example, a proportion of 0.1 to 20 parts by weight relative to 100 parts by weight of the carboxyl group-containing resin (A) is preferred and a proportion of 0.5 to 15 parts by weight is more preferable.

Other Ingredients

To the alkali-developable photosensitive resin composition of the present invention may optionally be incorporated conventional additives including conventional colorants such as copper phthalocyanine blue, phthalocyanine green, iodine green, disazo yellow, crystal violet, titanium oxide, carbon black, and naphthalene black, conventional thermal polymerization inhibitors such as hydroquinone, hydroquinone monomethyl ether, tert-butylcatechol, pyrogallol, and phenothiazine, conventional thickening agents such as fine powder silica, organic bentonite, and montmorillonite, defoaming agents and/or leveling agents such as silicone-based agents, fluorine-based agents, and polymer-based agents, and adhesion promoters and silane coupling agents such as imidazole-based agents, triazole-based agents, and triazole-based agents.

When the alkali-developable photosensitive resin composition of the present invention is used for the formation of a solder resist of a printed wiring board, a tack-free coating can be formed by optionally adjusting the composition to a viscosity suitable for an application method, then applying it to, for example, a printed wiring board on which a circuit has been formed in advance by such a method as screen printing, curtain coating, spray coating, and roll coating, and optionally executing drying treatment at, for example, a temperature of about 60 to about 100° C. Then, a resist pattern can be formed by exposing the coating to active light selectively through a photomask formed in a prescribed exposure pattern, and developing unexposed portions with an aqueous alkali solution, a curing reaction of the thermosetting component and polymerization of a photosensitive resin component are promoted and characteristics of a resulting resist coating such as heat resistance, solvent resistance, acid resistance, moisture absorption resistance, PCT resistance, adhesion property, and electrical characteristics can be improved by further thermosetting the resist pattern by heating it to, for example, a temperature of about 140 to 180° C.

As the aqueous alkali solution to be used for the development, aqueous alkali solutions of potassium hydroxide, sodium hydroxide, sodium carbonate, potassium carbonate, sodium phosphate, sodium silicate, ammonia, amines, etc. can be used. Suited as the source of the applied light for photocuring are a low-pressure mercury lamp, a medium-pressure mercury lamp, a high-pressure mercury lamp, an ultrahigh-pressure mercury lamp, a xenon lamp, and a metal halide lamp.

EXAMPLES

The present invention is described below in more detail on the basis of examples and comparative examples, but the technical scope and embodiments of the present invention are not limited to the examples. All "parts" or "%" in the example and the comparative example are by weight unless otherwise designated. Tests for the values of attributes of the compositions of the examples were performed by the methods described below.

Synthesis Example 1

Synthesis of Carboxyl Group-Containing Resin Solution

Four-necked flask equipped with a stirrer and a reflux condenser was charged with 214 g of a cresol novolak type epoxy resin, EPICLON N-695 (produced by Dainippon Ink & Chemicals, Inc., epoxy equivalent weight=214). Then, 103 g of carbitol acetate and 103 g of a petroleum aromatic solvent (produced by Japan Energy Corporation, commercial name: Cactus Fine SF-01) were added and heated to dissolve. Subsequently, 0.1 g of hydroquinone as a polymerization inhibitor and 2.0 g of triphenylphosphine as a reaction catalyst were added. The resulting mixture was heated to 95 to 105° C. and 72 g of acrylic acid was dropped slowly, followed by execution of a reaction for 16 hours. The resulting reaction product was cooled to 80 to 90° C. and then 91.2 g of tetrahydrophthalic anhydride was added, followed by execution of a reaction for 8 hours. After cooling, the resultant was taken out. The thus-obtained solution of a carboxyl group-containing resin (A) contained 65% of nonvolatiles and the solid matter of the solution had an acid value of 87.5 mgKOH/g. Hereinafter, the solution of this reaction product is called Varnish-1.

Synthesis Example 2

Synthesis of Carboxyl Group-Containing Resin

Four-necked flask equipped with a stirrer and a reflux condenser was charged with 214 g of a cresol novolak type epoxy resin, EPICLON N-695 (produced by Dainippon Ink & Chemicals, Inc., epoxy equivalent weight=214). Then, 206 g of carbitol acetate was added and heated to dissolve. Subsequently, 0.1 g of hydroquinone as a polymerization inhibitor and 2.0 g of triphenylphosphine as a reaction catalyst were added. The resulting mixture was heated to 95 to 105° C. and 72 g of acrylic acid was dropped slowly, followed by execution of a reaction for 16 hours. The resulting reaction product was cooled to 80 to 90° C. and then 91.2 g of tetrahydrophthalic anhydride was added, followed by execution of a reaction for 8 hours. After cooling, the resultant was taken out. The thus-obtained solution of a carboxyl group-containing resin (A) contained 65% of nonvolatiles and the solid matter of the solution had an acid value of 87.5 mgKOH/g. Hereinafter, the solution of this reaction product is called Varnish-2.

Synthesis Example 3

Synthesis of Carboxyl Group-Containing Resin

Four-necked flask equipped with a stirrer and a reflux condenser was charged with 214 g of a cresol novolak type epoxy resin, EPICLON N-695 (produced by Dainippon Ink & Chemicals, Inc., epoxy equivalent weight=214). Then, 103 g of carbitol acetate and 103 g of a petroleum aromatic solvent (produced by Idemitsu Kosan Co., Ltd., commercial name: Ipsol 150) were added and heated to dissolve. Subsequently, 0.1 g of hydroquinone as a polymerization inhibitor and 2.0 g of triphenylphosphine as a reaction catalyst were added. The resulting mixture was heated to 95 to 105° C. and 72 g of acrylic acid was dropped slowly, followed by execution of a reaction for 16 hours. The resulting reaction product was cooled to 80 to 90° C. and then 91.2 g of tetrahydrophthalic anhydride was added, followed by execution of a reaction for 8 hours. After cooling, the resultant was taken out. The thus-obtained solution of a carboxyl group-containing resin (A) contained 65% of nonvolatiles and the solid matter of the solution had an acid value of 87.5 mgKOH/g. Hereinafter, the solution of this reaction product is called Varnish-3.

The carboxyl group-containing resin solutions of Synthesis Examples 1 to 3 (Varnish-1, Varnish-2, Varnish-3) were used, mixed with the ingredients given in Table 1 in proportions (parts by mass), and preliminarily mixed with a stirrer, and then kneaded with a three-roll mill, whereby alkali-developable photosensitive resin compositions were prepared. The degree of dispersion of the resultant alkali-developable photosensitive resin compositions was evaluated to be up to 15 μm by particle size measurement by using a grind meter manufactured by Erichsen.

Evaluation of Performance:

(1) Dryability to Finger Touch after Temporary Drying

Each of the alkali-developable photosensitive resin compositions of Examples 1 to 4 and Comparative Examples 1 to 3 was applied to the whole surface of a buffed copper-clad laminate by screen printing and then dried at 80° C. for 30 minutes, whereby a substrate was prepared. Then, the dryability to finger touch of the surface of the coating was evaluated.

○: The surface had no tackiness.

Δ: The surface had slight tackiness.

X: The surface had tackiness.

(2) Reagglomeration Test 50 g of each of the alkali-developable photosensitive resin compositions of Examples 1 to 4 and Comparative Examples 1 to 3 was weighed and left at rest at 50° C. for one day and additionally at 4° C. for one day, the presence of crystals in the composition was evaluated.

○: There was no crystal.

X: There were crystals.

(3) Naphthalene Content

The amount of naphthalene contained in each of the alkali-developable photosensitive resin compositions of Examples 1 to 4 and Comparative Examples 1 to 3 was determined by the testing method of USEPA8270D.

○: The naphthalene content was 300 ppm or less.

Δ: The naphthalene content was more than 300 and up to 1,000 ppm.

X: The naphthalene content was more than 1,000 ppm.

The results of the above-described tests are summarized in Table 2.

TABLE 1

| | Example 1 | Example 2 | Example 3 | Example 4 | Comparative Example 1 | Comparative Example 2 | Comparative Example 3 |
|---|---|---|---|---|---|---|---|
| Varnish-1 | 154 | 154 | | 154 | | | |
| Varnish-2 | | | 154 | | 154 | 154 | |
| Varnish-3 | | | | | | | 154 |
| Photopolymerization initiator (B-1) | 10 | 10 | 10 | 10 | 10 | 10 | 10 |
| Diluting Solvent (E-1) | 8 | 4 | 4 | 7.5 | | | |
| Diluting Solvent (E-2) | | | | 0.5 | 8 | 4.8 | |
| Diluting Solvent (E-3) | | | | | | | 8 |
| Diluting Solvent (E-4) | | 4 | 4 | | | 3.2 | |
| Phthalocyanine green | 1 | 1 | 1 | 1 | 1 | 1 | 1 |
| DPHA (C-1) | 15 | 15 | 15 | 15 | 15 | 15 | 15 |
| Filler (D-1) | 120 | 120 | 120 | 120 | 120 | 120 | 120 |
| Thermosetting component (F-1) | 20 | 20 | 20 | 20 | 20 | 20 | 20 |
| Thermosetting component (F-2) | 20 | 20 | 20 | 20 | 20 | 20 | 20 |
| DICY | 0.4 | 0.4 | 0.4 | 0.4 | 0.4 | 0.4 | 0.4 |
| Powdered melamine | 4 | 4 | 4 | 4 | 4 | 4 | 4 |
| Silicone-based defoaming agent | 3 | 3 | 3 | 3 | 3 | 3 | 3 |

B-1: 2-Benzyl-2-dimethylamino-1-(4-morpholinophenyl)-butanone-1 (Irgacure 369 produced by Ciba Specialty Chemicals)
E-1: Naphthalene-poor petroleum aromatic solvent (Cactus Fine SF-01 produced by Japan Energy Corporation)
E-2: Naphthalene-rich petroleum aromatic solvent (Ipsol 150 produced by Idemitsu Kosan Co., Ltd.)
E-3: Carbitol acetate
E-4: Dipropylene glycol methyl ether acetate
C-1: Dipentaerythritol hexaacrylate
D-1: Barium sulfate (B-30 produced by Sakai Chemical Industry Co., Ltd.)
F-1: Triglycidyl isocyanurate (TEPIC-S produced by Nissan Chemical Industries, Ltd.)
F-2: Phenol novolac type epoxy resin (EPPN-201 produced by Nippon Kayaku Co., Ltd.)
DICY: Dicyandiamides

TABLE 2

| | Example 1 | Example 2 | Example 3 | Example 4 | Comparative Example 1 | Comparative Example 2 | Comparative Example 3 |
|---|---|---|---|---|---|---|---|
| Dryability to finger touch | ○ | ○ | Δ | ○ | x | x | x |
| Reagglomeration test | ○ | ○ | ○ | ○ | Δ | Δ | ○ |
| Naphthalene content | ○ | ○ | ○ | ○ | x | Δ | x |

The results provided in Tables 1 and 2 clearly showed that Examples 1 to 4 using the petroleum aromatic solvent low in naphthalene content resulted in excellent dryability to finger touch of a dried coating, no defects such as reagglomeration, and low content of naphthalene, which adversely affect the environment and human bodies.

Accordingly, the alkali-developable photosensitive resin composition of the present invention has great industrial value because it can provide a resin composition for solder resist, the composition being superior to conventional products in stability and workability.

What is claimed is:

1. An alkali-developable photosensitive resin composition, comprising:

a carboxyl group-containing resin;

a photopolymerization initiator;

a compound comprising a plurality of ethylenically unsaturated groups in a molecule of the compound;

a filler; and a petroleum aromatic solvent, wherein the alkali-developable photosensitive resin composition has a naphthalene content of 300 ppm or less, and the petroleum aromatic solvent comprises 1,2,4-trimethylbenzene and 1,2,3-trimethylbenzene in an amount of from 10 to 30% by volume, an aromatic component having 10 carbon atoms in an amount of 60% by volume or more, 1,3,5-trimethylbenzene in an amount of less than 1% by volume, and benzene, toluene, and xylene in an amount of less than 0.01% by volume.

2. The alkali-developable photosensitive resin composition according to claim 1, wherein the petroleum aromatic solvent has a naphthalene content of 500 ppm or less with respect to the petroleum aromatic solvent.

3. The alkali-developable photosensitive resin composition according to claim 1, further comprising:

a thermosetting component.

4. The alkali-developable photosensitive resin composition according to claim 2, further comprising:

a thermosetting component.

* * * * *